United States Patent
Passlack et al.

[11] Patent Number: 6,030,453
[45] Date of Patent: Feb. 29, 2000

[54] III-V EPITAXIAL WAFER PRODUCTION

[75] Inventors: Matthias Passlack, Chandler; Jonathan K. Abrokwah; Ravi Droopad, both of Tempe; Corey D. Overgaard, Phoenix, all of Ariz.

[73] Assignee: Motorola, Inc., Schaumburg, Ill.

[21] Appl. No.: 08/812,950

[22] Filed: Mar. 4, 1997

[51] Int. Cl.[7] .................................................. C30B 23/02
[52] U.S. Cl. ..................... 117/104; 117/105; 438/236; 438/763; 438/779; 438/767
[58] Field of Search ........................... 117/105, 104; 438/763, 779, 767, 236

[56] References Cited

U.S. PATENT DOCUMENTS

| | | | |
|---|---|---|---|
| 4,745,082 | 5/1988 | Kwok | 437/39 |
| 4,859,253 | 8/1989 | Buchanan et al. | 148/33.3 |
| 4,935,789 | 6/1990 | Calviello | 357/22 |
| 5,665,658 | 9/1997 | Passlack | 438/763 |
| 5,693,565 | 12/1997 | Camilletti et al. | 437/192 |
| 5,767,388 | 6/1998 | Fleischer et al. | 73/31.06 |
| 5,821,171 | 10/1998 | Hong et al. | 438/767 |

*Primary Examiner*—Robert Kunemund
*Attorney, Agent, or Firm*—Rennie W. Dover

[57] ABSTRACT

A production process for protecting the surface of compound semiconductor wafers includes providing a multi-wafer epitaxial production system with a transfer and load module, a III–V growth chamber and an insulator chamber. The wafer is placed in the transfer and load module and the pressure is reduced to $\leq 10^{-10}$ Torr, after which the wafer is moved to the III–V growth chamber and layers of compound semiconductor material are epitaxially grown on the surface of the wafer. The wafer is then moved through the transfer and load module to the insulator chamber and an insulating cap layer is formed by thermally evaporating gallium oxide molecules from an effusion cell using an evaporation source in an oxide crucible, which oxide crucible does not form an eutectic alloy with the evaporation source

10 Claims, 2 Drawing Sheets

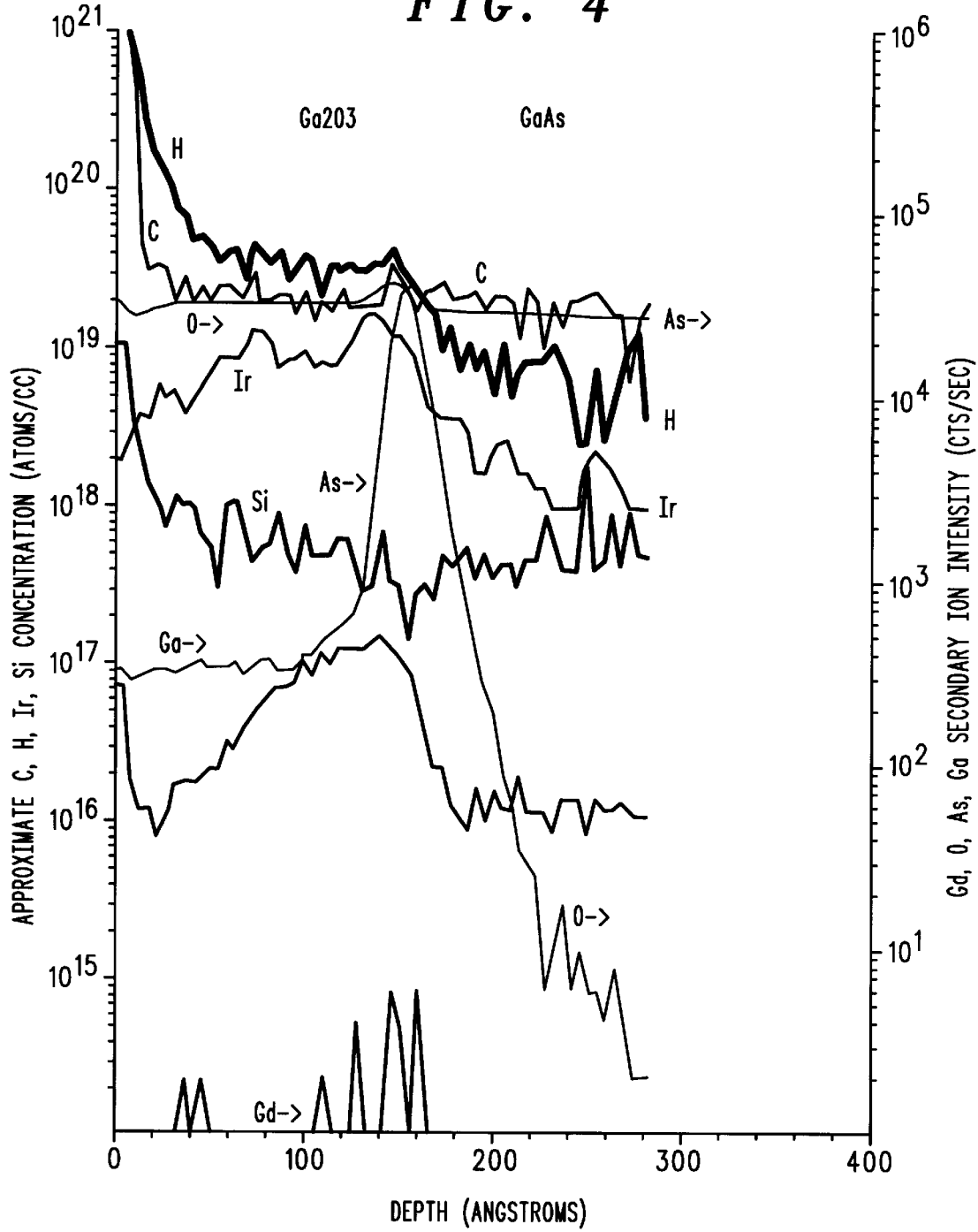

III–V EPITAXIAL WAFER PRODUCTION

FIELD OF THE INVENTION

The present invention pertains to III–V wafer production and more specifically to surface protection of III–V structures.

BACKGROUND OF THE INVENTION

Prior art III–V epitaxial wafer production employs a semiconductor layer to complete the epitaxial structure. Various semiconducting top layers are being used, for example GaAs, $In_{1-x}Ga_xAs$, $Al_{1-x}Ga_xAs$, InGaAsP, etc., depending on the specific device/circuit application and semiconductor substrate. The use of semiconducting top layers in prior art epitaxial wafer production results in uncontrollable and detrimental electrical and chemical surface properties. Electronic and optoelectronic device/circuit processing is complicated and device/circuit performance is affected. The degree of complication and degradation is subject to the particular device/circuit processing and application. For example, the fabrication and performance of unipolar transistor devices/circuits is hampered by plasma exposure, Fermi level pinning, and instability of the gate-source and gate-drain regions. The fabrication of functional and stable MOSFET devices has been impossible.

Uncontrollable and detrimental electrical and surface properties are caused by chemical surface reactions resulting in the formation of native oxides and dangling bonds. In turn, the surface is rendered thermodynamically unstable and exhibits a pinned Fermi level. Specifically, the high GaAs surface reactivity induces Fermi level pinning and surface instability after surface exposure as small as $10^3$ Langmuirs (1 Langmuir=$10^{-6}$ Torr). Surface preparation techniques conducted after exposure to air (sulfur, selenium, etc.) have proven to be inefficient and unstable.

Prior art, for instance, M. Passlack et al., Appl. Phys. Lett., vol 68, 1099 (1996), Appl. Phys. Lett., vol. 68, 3605 (1996), and Appl. Phys. Lett., vol 69, 302, (1996), U.S. Pat. No. 5,451,548, entitled "Electron beam Deposition of gallium oxide thin films using a single purity crystal layer", issued Sep. 19, 1995, and U.S. Pat. No. 5,550,089, entitled "Gallium Oxide Coatings for Optoelectronic Devices Using Electron Beam Evaporation of a High Purity Single Crystal $Gd_3Ga_5O_{12}$ Source", issued Aug. 27, 1996, reported that thermodynamically stable, III–V surfaces (interfaces) with low interface state density can be fabricated when a specific insulating cap layer is deposited in-situ on GaAs based semiconductor epitaxial layers using e-beam evaporation of $Gd_3Ga_5O_{12}$ while maintaining ultra-high vacuum (UHV). For GaAs, pivotal aspects include an extremely low GaAs surface exposure to impurities (<10–100 Langmuirs) and the preservation of GaAs bulk and surface stoichiometry, the complete exclusion of GaAs surface oxidation, and the requirements of a specific atomic structure associated with the interfacial atoms of GaAs and the deposited molecules. However, the process described in the prior art is not manufacturable since it is plagued by dc instability and poor reliability.

Accordingly, it would be highly advantageous to provide new methods of manufacturing which overcome these problems.

It is a purpose of the present invention to provide a new and improved III–V epitaxial wafer production process.

It is another purpose of the present invention to provide a new and improved III–V epitaxial wafer with improved stability and reliability.

It is still another purpose of the present invention to provide a new and improved III–V wafer which is relatively easy to fabricate and use.

SUMMARY OF THE INVENTION

The above problems and others are at least partially solved and the above purposes and others are realized in a method of protecting the surface of a compound semiconductor wafer structure including the steps of providing a compound semiconductor wafer structure with a surface and forming an insulating cap layer on the surface of the wafer structure by thermally evaporating insulating material onto the wafer structure.

In a specific semiconductor production process, a multi-wafer epitaxial production system is provided including a transfer and load module with a III–V growth chamber attached and an insulator chamber attached. A compound semiconductor wafer with a surface is placed in the transfer and load module and the pressure in the multi-wafer production system is reduced to $\leq 10^{-10}$ Torr. The compound semiconductor wafer is moved to the III–V growth chamber and layers of compound semiconductor material are epitaxially grown on the surface of the compound semiconductor wafer. The compound semiconductor wafer is then moved to the transfer and load module and then to the insulator chamber, without removing it from the multi-wafer production system, and an insulating cap layer is formed by thermally evaporating material onto the layer of compound semiconductor material.

BRIEF DESCRIPTION OF THE DRAWINGS

Referring to the drawings:

FIG. 4 is a graphical representation of approximate concentrations and ion intensities in a $Ga_2O_3$ film in the case of $Gd_3Ga_5O_{12}$ as an evaporation source.

DESCRIPTION OF THE PREFERRED EMBODIMENT

Figure 1:
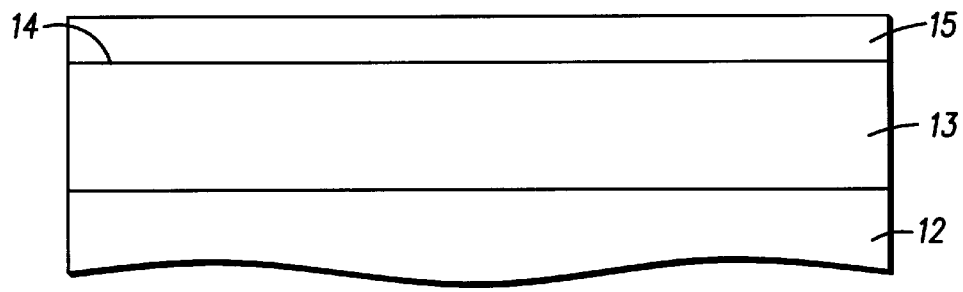
FIG. 1 illustrates a simplified cross-sectional view of a prior art compound semiconductor substrate with a native oxide formation on the surface thereof.

Referring specifically to FIG. 1, a prior art III–V compound semiconductor wafer 10 is illustrated. Wafer 10 includes a substrate with one or more layers of III–V material epitaxially formed on the upper surface thereof. For purposes of this disclosure the substrate and any epitaxial layers formed thereon will be referred to simply as a compound semiconductor wafer structure, which in FIG. 1 is designated 12. Compound semiconductor wafer structure 12 has a top layer 13 with an upper surface 14. Any exposure of compound semiconductor wafer structure 12 or top layer 13 to ambient conditions (air, processing environments, etc.) results in a layer 15 of native oxide being formed on the surface. Generally, layer 15 is very thin, approximately 10 A thick. The interface between top layer 13 and native oxide layer 15 is thermodynamically unstable and Fermi level pinned.

A compound semiconductor wafer structure 20 formed in accordance with the present invention is illustrated in FIG.

2. Compound semiconductor wafer structure 20 generally includes a substrate with one or more layers of III–V material epitaxially formed on the upper surface thereof, hereafter designated 22. Compound semiconductor wafer structure 20 has a top layer 23 with an upper surface 24. It will of course be understood that in some specific applications (or on some portions of compound semiconductor wafer structure 20) there may be no epitaxial layers present on the substrate and upper surface 24 may simply be the upper surface of the substrate. An insulating cap layer 25 is thermally evaporated onto surface 24 of compound semiconductor wafer structure 20.

Figure 2:
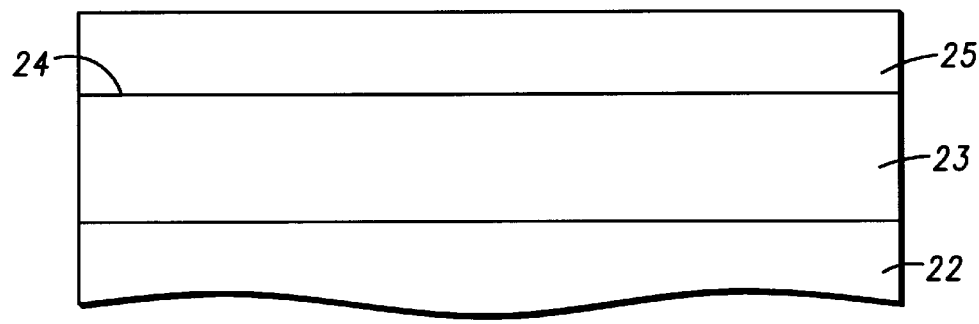
FIG. 2 illustrates a simplified cross-sectional view of a compound semiconductor substrate with epitaxial and cap layers in accordance with the present invention.
Figure 3:
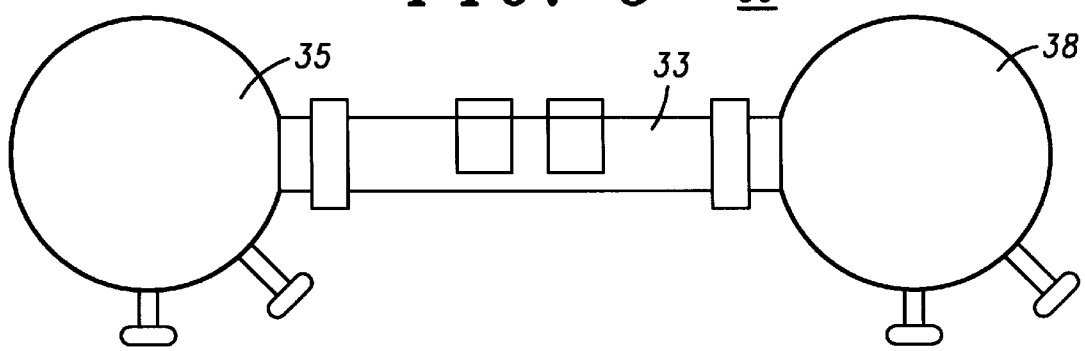
FIG. 3 illustrates a multi-wafer epitaxial production system utilized in fabricating the structure of FIG. 2 in accordance with the present invention.

Turning now to FIG. 3, a multi-wafer epitaxial production system 30 is illustrated, which is utilized in fabricating compound semiconductor wafer structure 20 of FIG. 2 in accordance with the present invention. System 30 includes a transfer and load module 33, a III–V growth chamber 35 attached to transfer and load module 33, and an insulator chamber 38 attached to transfer and load module 33. Each of chambers 35 and 38 are attached to transfer and load module 33 so that wafers, chips, etc. can be processed in each chamber without removing the wafers, chips, etc. from system 30. Therefore, once a wafer is introduced into system 30 and a vacuum is drawn, the wafer is not subjected to the environment until the process is completed.

Thus, as an example of a process of protecting the surface of a compound semiconductor wafer structure in accordance with the present invention, a compound semiconductor wafer is placed in transfer and load module 33 and the pressure in multi-wafer production system 30 is reduced to $\leq 10^{-10}$ Torr. The wafer is then moved to III–V growth chamber 35 and one or more layers of compound semiconductor material are epitaxially grown on the surface to produce a compound semiconductor wafer structure (e.g. compound semiconductor wafer structure 20). After the growth of top layer 23, compound semiconductor wafer structure 20 is moved to transfer and load module 33 and then to insulator chamber 38. In insulator chamber 38, insulating cap layer 25 is formed on surface 24 of compound semiconductor wafer structure 20 by thermally evaporating insulating material onto wafer structure 20.

In a preferred embodiment of the process, insulating cap layer 25 is thermally evaporated onto surface 24 of wafer structure 20 by thermally evaporating gallium oxide molecules from an effusion cell using an evaporation source in an oxide crucible. The evaporation source is selected from one of polycrystalline $Ga_2O_3$ having a melting point $m_{po}$, single-crystal $Ga_2O_3$ having a melting point $m_{po}$, or a polycrystalline or single-crystal material containing a $Ga_2O_3$ component having a melting point $m_{po}$. The oxide crucible containing the evaporation source is selected from either an oxide crucible with a melting point $m_p > m_{po}$, which oxide crucible does not exhibit a eutectic alloy with the evaporation source, or an oxide crucible having a eutectic temperature with the evaporation source, which eutectic temperature is higher than the evaporation temperature of the source. Further, the oxide crucible is preferably formed of material having a relatively high bandgap, i.e. generally $\geq 4$ eV.

In a specific example, the oxide crucible is formed from one of the following materials: BeO (mp=2507° C.), $ZrO_2$ (mp=2710° C.), $HfO_2$ (mp=2774° C.), $La_2O_3$ (mp=2305° C.), $A_2O_3$ (mp=2050° C.), or $ThO_2$ (mp=3390° C.). Using one of the above materials for the oxide crucible, the evaporation source is polycrystalline or single-crystal $Ga_2O_3$ or a polycrystalline or single-crystal material containing a $Ga_2O_3$ component ($m_{po}$=1725° C.). In another specific example, the oxide crucible is formed from one of the following materials: $ZrO_2$ (mp=2710° C.), $HfO_2$ (mp=2774° C.), $La_2O_3$ (mp=2305° C.), $Al_2O_3$ (mp=2050° C.), or $ThO_2$ (mp=3390° C.) and the evaporation source includes one of $Gd_3Ga_5O_{12}$ ($m_{po}$=1700° C.) and $MgGa_2O_4$ ($m_{po}$=1700° C.).

Thus, compound semiconductor wafer structure 20 is protected from exposure to ambient conditions until insulating cap layer 25 is in place. Because insulating cap layer 25 is formed in system 30 of FIG. 3, the structure or epitaxial layers are never subjected to ambient conditions and the interface between the substrate or epitaxial layers and insulating cap layer 25 is thermodynamically stable with excellent electrical properties. In the specific example of a compound semiconductor wafer structure with a GaAs surface and a layer of oxide deposited thereon, the $GaAs\text{-}Ga_2O_3$ interface exhibits monolayer abruptness and the oxide has a surface roughness (rms) $\leq 2.5$ Å. Also, it has been found that there is excellent uniformity of interface state density over a fabricated wafer. The interface state density is in general comparable or better than prior art densities ($10^{10}$ cm$^{-2}$ eV$^{-1}$). Further, in the specific example in which $Gd_3Ga_5O_{12}$ is used as an evaporation source, it has been found that $Ga_2O_3$ films include Gd levels below the detection limit of Selective Ion Mass Spectroscopy (SIMS), as illustrated by the graphical representation of FIG. 4.

The thermally evaporated insulating layer on the wafer structure of the disclosed process replaces the exposed semiconductor surface of prior art epitaxial products and the buried epitaxial semiconductor surface is electrically and chemically stable and exhibits excellent electrical properties. Thus, the improved compound semiconductor wafer structure fabricated in accordance with the novel surface protection process has the following advantages: excellent electrical and chemical properties, passivation and protection of the semiconductor epilayer structure and devices/circuits formed therein; stability of the excellent electronic and chemical surface properties of the semiconductor epilayer structure and devices/circuits formed therein; simplification of device/circuit processing; improved reproducibility and reliability of devices/circuits; and essential parts of the semiconductor surface are not exposed during processing, preserving electronic passivation.

These improvements essentially solve or overcome the problems of the prior art, such as dc instability and poor reliability, and therefore provide a highly manufacturable process.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of protecting the surface of a compound semiconductor wafer structure including the steps of:

providing a compound semiconductor wafer structure with a surface;

positioning a crystalline, high purity $Ga_2O_3$ evaporation source consisting essentially of only $Ga_2O_3$ into an oxide crucible wherein the $Ga_2O_3$-oxide crucible system is stable at the $Ga_2O_3$ evaporation temperature; and forming a $Ga_2O_3$ layer on the surface of the wafer structure by thermally evaporating gallium oxide molecules from the crystalline, high purity $Ga_2O_3$ evaporation source onto the surface of the compound semiconductor wafer structure.

2. A method of protecting the surface of a semiconductor wafer comprising the steps of:

provyding a multi-wafer epitaxial production system including a transfer and load module with a III–V growth chamber attached and an insulator chamber attached;

providing a compound semiconductor wafer with a surface;

positioning a crystalline, high purity $Ga_2O_1$ evaporation source consisting essentially of only $Ga_2O_1$ into an oxide crucible wherein the $Ga_2O_1$-oxide crucible system is stable at the $Ga_2O_1$ evaporation temperature;

placing the compound semiconductor wafer in the transfer and load module;

reducing the pressure in the multi-wafer production system to $\leq 10^{-10}$ Torr;

moving the compound semiconductor wafer to the III–V growth chamber and epitaxially growing layers of compound semiconductor material on the surface of the compound semiconductor wafer;

moving the compound semiconductor wafer to the transfer and load module and then to the insulator chamber and forming an insulating cap layer by thermally evaporating gallium oxide molecules from the crystalline, high purity $Ga_2O_1$ evaporation source onto the layers of compound semiconductor material.

3. A method of protecting the surface of a semiconductor wafer as claimed in claim 2 wherein the step of providing the compound semiconductor wafer includes providing a compound semiconductor wafer of gallium-arsenide (GaAs).

4. A method of protecting the surface of a compound semiconductor wafer structure as claimed in claim 1 wherein the step of providing the compound semiconductor wafer structure includes providing a compound semiconductor wafer with a semiconductor device formed thereon.

5. A method of protecting the surface of a compound semiconductor wafer structure as claimed in claim 1 wherein the step of positioning a crystalline, high purity $Ga_2O_1$ evaporation source includes using an oxide crucible having an energy bandgap $\geq 4$ eV.

6. A method of protecting the surface of a compound semiconductor wafer structure as claimed in claim 1 wherein the step of positioning a crystalline, high purity $Ga_2O_3$ evaporation source includes positioning the oxide crucible in an effusion cell.

7. A method of protecting the surface of a compound semiconductor wafer structure as claimed in claim 1 wherein the step of positioning a crystalline, high purity $Ga_2O_1$ evaporation source includes positioning the crystalline, high purity $Ga_2O_3$ evaporation source having an evaporation temperature $m_{po}$ in an oxide crucible with a melting point $m_p > m_{po}$ which oxide crucible does not exhibit a eutectic alloy with the crystalline $Ga_2O_3$ evaporation source.

8. A method of protecting the surface of a compound semiconductor wafer structure as claimed in claim 1 wherein the step of positioning a crystalline, high purity $Ga_2O_3$ evaporation source includes positioning the crystalline $Ga_2O_3$ evaporation source having an evaporation temperature $m_{po}$ in an oxide crucible with a melting point $m_p > m_{po}$ which oxide crucible having a eutectic alloy with the crystalline $Ga_2O_3$ evaporation source which eutectic temperature is higher than the evaporation temperature of the crystalline $Ga_2O_3$ evaporation source.

9. A method of protecting the surface of a compound semiconductor wafer structure as claimed in claim 1 wherein the step of positioning a crystalline, high purity $Ga_2O_3$ evaporation source includes positioning the crystalline $Ga_2O_3$ evaporation source in a crucible of beryllium oxide.

10. A method of protecting the surface of a semiconductor wafer as claimed in claim 1 wherein the step of providing the compound semiconductor wafer includes providing a compound semiconductor wafer of gallium-arsenide.

* * * * *

UNITED STATES PATENT AND TRADEMARK OFFICE
CERTIFICATE OF CORRECTION

PATENT NO. : 6,030,453  Page 1 of 1
DATED : February 29, 2000
INVENTOR(S) : Matthias Passlack, Jonathon K. Abrokwah, Ravi Droopad, Corey D. Overgaard It is certified that error appears in the above-identified patent and that said Letters Patent is hereby corrected as shown below:

Column 5, claim 2,
Line 2, delete "stops" and replace with -- steps --.
Line 16, delete "$Ga_2O_1$" and replace with -- $Ga_2O_3$ --.
Line 22, add ";" after chamber.

Column 6, claim 5,
Line 3, delete "$Ga_2O_1$" and replace with -- $Ga_2O_3$ --.

Column 6, claim 7,
Line 13, delete "$Ga_2O_1$" and replace with -- $Ga_2O_3$ --.

Signed and Sealed this

Second Day of April, 2002

Attest:

JAMES E. ROGAN
*Attesting Officer*    *Director of the United States Patent and Trademark Office*